(12) United States Patent
Hallal et al.

(10) Patent No.: US 10,547,385 B2
(45) Date of Patent: Jan. 28, 2020

(54) TRANSCEIVER MODULE INCLUDING OPTICAL SENSOR AT A ROTATIONALLY SYMMETRIC POSITION

(71) Applicant: ams Sensors Singapore Pte. Ltd., Singapore (SG)

(72) Inventors: Bassam Hallal, Thalwil (CH); Hartmut Rudmann, Jona (CH); Mario Cesana, Au (CH); Nicole Ebentheuer, Zurich (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/504,613

(22) PCT Filed: Aug. 18, 2015

(86) PCT No.: PCT/SG2015/050263
§ 371 (c)(1),
(2) Date: Feb. 16, 2017

(87) PCT Pub. No.: WO2016/028226
PCT Pub. Date: Feb. 25, 2016

(65) Prior Publication Data
US 2017/0244490 A1  Aug. 24, 2017

Related U.S. Application Data

(60) Provisional application No. 62/086,781, filed on Dec. 3, 2014, provisional application No. 62/039,064, filed on Aug. 19, 2014.

(51) Int. Cl.
*H04B 10/40* (2013.01)
*H04B 10/80* (2013.01)
(Continued)

(52) U.S. Cl.
CPC ......... *H04B 10/40* (2013.01); *H04B 10/1123* (2013.01); *H04B 10/1143* (2013.01);
(Continued)

(58) Field of Classification Search
None
See application file for complete search history.

(56) References Cited

U.S. PATENT DOCUMENTS 5,555,334 A  9/1996 Ohnishi et al.
6,229,940 B1 *  5/2001 Rice ..................... G02B 6/2848
                                                        257/98
(Continued)

FOREIGN PATENT DOCUMENTS

WO  2006/103512  10/2006
WO  2016/010481   1/2016

OTHER PUBLICATIONS

International Search Report and Written Opinion issued by ISA/AU dated Nov. 16, 2015 for PCT/SG2015/050263.
(Continued)

*Primary Examiner* — David W Lambert
(74) *Attorney, Agent, or Firm* — Michael Best & Friedrich LLP

(57) ABSTRACT

An optoelectronic module includes a transceiver operable to transmit data optically. The transceiver includes a light emitter to emit light from the module, and a light detector to detect light entering the module. The light detector is disposed at a rotationally symmetric position with respect to a central axis of the module. Such modules can help facilitate the exchange of data optically between two devices.

17 Claims, 7 Drawing Sheets

(51) Int. Cl.
*H04B 10/112* (2013.01)
*H04B 10/114* (2013.01)
*H04L 5/16* (2006.01)
*H04M 1/737* (2006.01)
*G02B 19/00* (2006.01)
*H01S 5/022* (2006.01)
*H01S 5/183* (2006.01)

(52) U.S. Cl.
CPC ........... H04B 10/80 (2013.01); H04L 5/16 (2013.01); H04M 1/737 (2013.01); *G02B 19/0009* (2013.01); *H01S 5/02288* (2013.01); *H01S 5/183* (2013.01); *H01S 2301/18* (2013.01)

(56) References Cited

U.S. PATENT DOCUMENTS

| | | | |
|---|---|---|---|
| 6,751,420 B1* | 6/2004 | Kienzle | H04B 10/1143 398/129 |
| 7,058,309 B1* | 6/2006 | Eisenberger | G02B 6/4246 385/14 |
| 2002/0150354 A1 | 10/2002 | Zaborsky et al. | |
| 2003/0053769 A1* | 3/2003 | Schunk | G02B 6/4246 385/93 |
| 2004/0114860 A1* | 6/2004 | Dultz | G02B 6/4206 385/31 |
| 2011/0150493 A1* | 6/2011 | Nakaso | H04B 10/1143 398/130 |
| 2011/0214736 A1* | 9/2011 | Lee | H01L 29/18 136/258 |
| 2014/0064675 A1* | 3/2014 | Tanaka | G02B 6/42 385/89 |
| 2016/0291200 A1 | 10/2016 | Bakin et al. | |
| 2016/0292506 A1 | 10/2016 | Rudmann et al. | |

OTHER PUBLICATIONS

Hesselmann et al., "FlashLight: Optical Communication between Mobile Phones and Interactive Tabletops," ITS 2010: Interactions, Nov. 7-10, 2010, Saarbrucken, Germany.

* cited by examiner

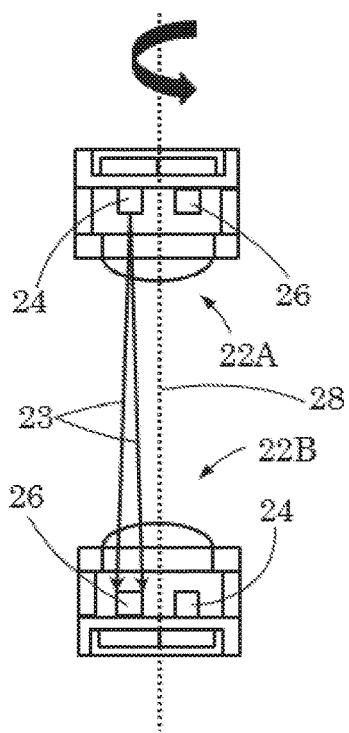
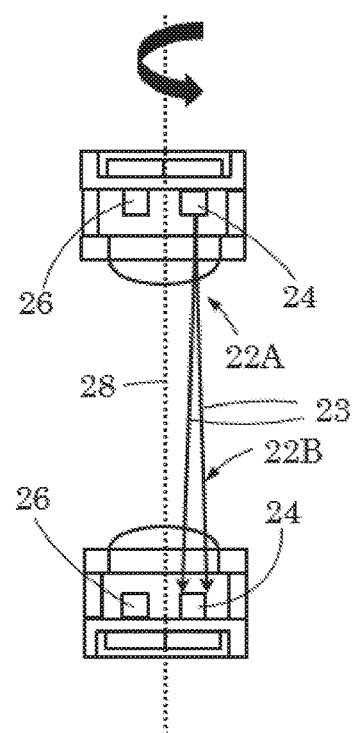
FIG. 2A
FIG. 2B

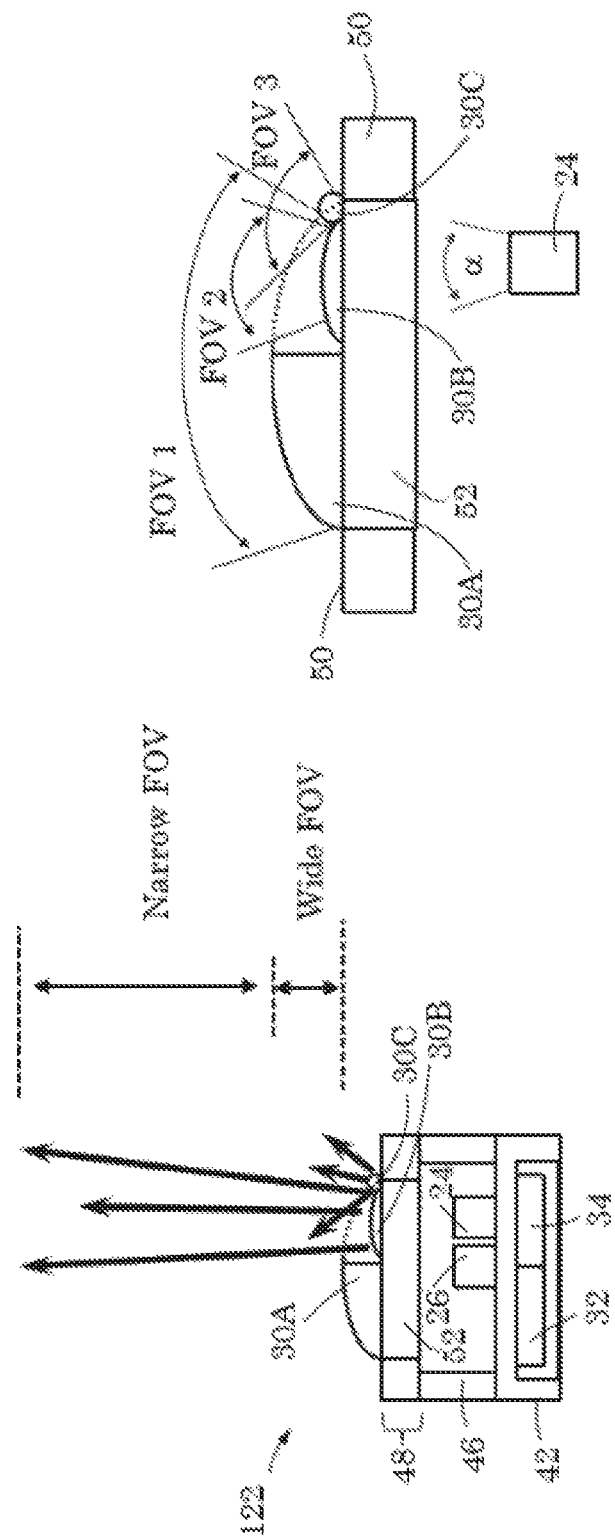

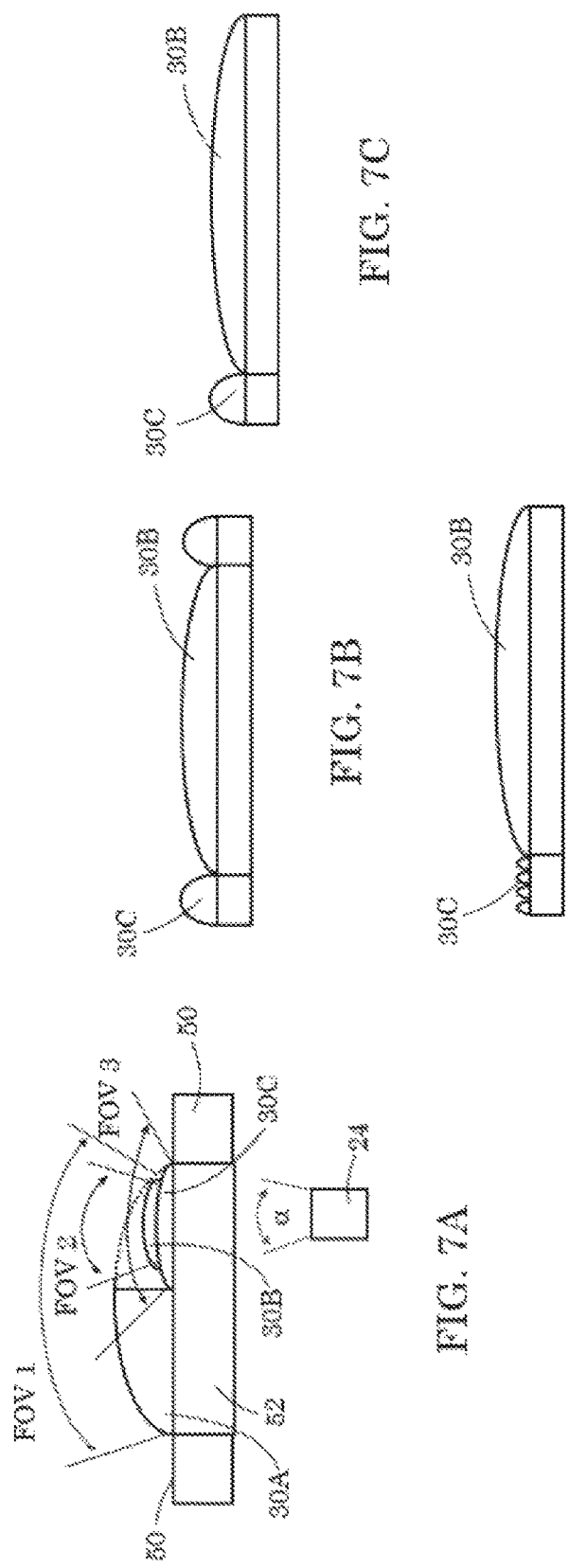

TRANSCEIVER MODULE INCLUDING OPTICAL SENSOR AT A ROTATIONALLY SYMMETRIC POSITION

TECHNICAL FIELD

This disclosure relates to optoelectronic transceiver modules for optical communications.

BACKGROUND

Light provides enormous potential for data transmission with very high data rates. In some cases, optical data transmission uses optical fibers as the transmission medium because light can be guided in fibers over very long distances with very low losses, while avoiding alignment issues and atmospheric influences. However, there also are applications for free-space optical (FSO) communications that use light propagating in free space to transmit data wirelessly. Free-space point-to-point optical links can be implemented, for example, using infrared (IR) or near-IR light (e.g., 750-1600 nm). These systems typically use laser transmitters and offer a cost-effective protocol-transparent link with high data rates (e.g., 10 Gbit/s per wavelength).

Optical data transmission is increasingly used in various fields (e.g., telephony, Internet traffic, cable television) primarily for larger transmission distances of at least a few kilometers. There is, however, a growing trend to consider using optical systems for smaller and smaller transmission distances. For example, there is the potential to use optical data transmission for communications between mobile devices such as smartphones, which have become popular and which consumers have come to rely on for many aspects of their daily life.

SUMMARY

This disclosure describes optoelectronic transceiver modules that include an optical detector at a rotationally symmetric position.

For example, in one aspect, an optoelectronic module includes a transceiver operable to transmit data optically. The transceiver includes a light emitter to emit light from the module, and a light detector to detect light entering the module. The light detector is disposed at a rotationally symmetric position with respect to a central axis of the module.

In some implementations, the module includes a lens element to project light from the light emitter out of the module into a far field, and another lens element to project light from the light emitter out of the module into a near field. The lens element to project light into the far field preferably has a narrower field-of-view than the lens element to project light into the near field. The module also may include another lens element to facilitate collection of incoming light by the light detector from both the far field and the near field.

In some implementations, the modules described here can help facilitate the exchange of data optically between two devices. For example, when two devices, each of which includes a respective transceiver module, are at a given distance from one another and their respective central axes are aligned with one another, the beam divergence of an optical signal from the light emitter of a given one of the modules can project a lateral distance that encompasses the light detector of the second transceiver module regardless of the relative rotational positions of the modules with respect to one another. Thus, regardless of a relative angle of rotation of the transceiver modules with respect to a central axis of each module, the light detector of each transceiver module can be within an angle of emission of the light emitter of the other transceiver module.

According to another aspect, this disclosure describes a method for communicating data optically between a first communication device including a first transceiver module and a second communication device including a second transceiver module. The method includes bringing the first and second transceiver modules into proximity with one another such that the central axes of the first and second transceiver modules are substantially aligned with one another. The method further includes causing an optical signal to be emitted from the light emitter of the first transceiver module for reception by the light detector of the second transceiver while the first transceiver module is at a first angle of rotation with respect to the second transceiver module, and causing an optical signal to be emitted from the light emitter of the first transceiver module for reception by the light detector of the second transceiver while the first transceiver module is at a different second angle of rotation with respect to the second transceiver module.

In a further aspect, a first device is operable to communicate with another such device. The first device includes a transceiver module operable to transmit and receive data optically at a rate of gigabytes per second. The transceiver module includes a light emitter to emit light from the device, and a light detector to detect light entering the transceiver module. The light detector is disposed at a rotationally symmetric position with respect to a central axis of the transceiver module. In some implementations, the first device is operable in a half-duplex mode.

Other aspect, features and advantages will be readily apparent from the following detailed description, the accompanying drawings, and the claims.

BRIEF DESCRIPTION OF THE DRAWINGS

FIGS. 2A and 2B illustrate data transfer between the devices of FIG. 1 at different relative rotational positions.

FIGS. 6A and 6B illustrate details of an optics assembly for providing different fields-of-view for light emitter in the near and far fields.

FIG. 7A illustrates an example of an optics assembly employing a torus lens for providing different fields-of-view for a light emitter in the near and far fields.

FIG. 7B illustrates details of the optics assembly depicted in FIG. 7A.

FIG. 7C illustrates details of another optics assembly employing a torus lens for providing different fields-of-view for a light emitter in the near and far fields.

FIG. 7D illustrates details of yet another optics assembly employing a torus lens and a micro-lens array for providing different fields-of-view for a light emitter in the near and far fields.

DETAILED DESCRIPTION

Figure 1:
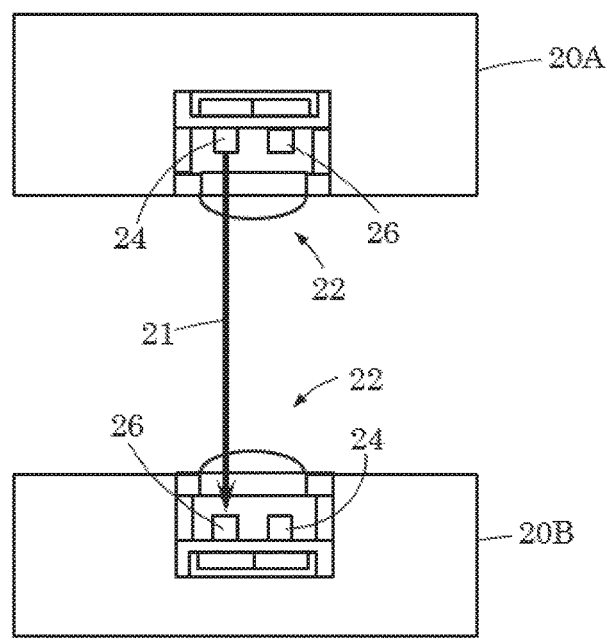
FIG. 1 illustrates an example of data being transferred optically between two devices.

As illustrated in FIG. 1, a first host device 20A (e.g., a handheld mobile device such as a smart phone) is operable to transmit data 21 back and forth with another such device 20B. The data is transmitted optically, for example, at a rate on the order of gigabytes per second rate (e.g., 5-10 Gbps). Each device 20A, 20B includes an optoelectronic module (transceiver) 22 that has a light emitter 24 and light detector 26. Both the emitter 24 and detector 26 preferably are operable at a Gbps rate. Thus, for example, the transceiver 22 can include a vertical cavity surface emitting laser (VCSEL) or laser diode as the light emitter 24. The light detector (e.g., a photodiode) 26 should operate at about the same rate as the emitter 24. Thus, the photodiode may be composed, for example, of a gallium-arsenide (GaAs)-based or other III-V compound semiconductor material(s) or other semiconductors with high charge carrier mobility. In some cases, a band-pass filter, which permits wavelengths of light emitted by the emitter to pass, may be positioned in the transmission path of the light detector 26.

The transceivers 22 can operate, for example, in a half-duplex mode such that, while an emitter 24 is emitting light signals (corresponding to data), the adjacent detector 26 on the same transceiver 22 does not detect light (or does not use the detected light). Likewise, while a detector 26 is being used to detect incoming light (corresponding to data), the adjacent light emitter 24 on the same transceiver 22 does not emit light.

If the transceivers 22 use narrow-beam divergence light sources 24 (i.e., VCSELS or laser diodes that have a narrow emission angle or field of view), the host devices 20A, 20B need to be aligned such that the emitter 24 and detector 26 on the first host device 20A are aligned, respectively, with the detector 26 and emitter 24 on the second host device 20B. In some instances, this demand can be challenging for users. For example, even if the two devices 20A, 20B are brought into close contact with one another such that their respective central axes 28 aligned, the devices 20A, 20B still may be rotationally misaligned. Such a scenario is illustrated by reference to FIGS. 2A and 2B.

FIG. 2A illustrates a situation in which the transceivers 22A, 22B are aligned such that the emitter 24 in the first transceiver 22A is substantially aligned with the detector 26 of the second transceiver 22B. In particular, light 23 (i.e., optical data signals 21) emitted by the narrow-beam emitter 24 in the first transceiver 22A is directed toward, and can be sensed, by the detector 26 in the second transceiver 22B. Likewise, light 23 (i.e., optical data signals 21) emitted by the narrow-beam emitter 24 in the second transceiver 22B is directed toward, and can be sensed, by the detector 26 in the first transceiver 22A. In the situation depicted by FIG. 2A, optical data can be transferred between the two host devices. On the other hand, if the host devices are rotated, for example, by 180°, then as shown in FIG. 2B, the transceivers 22A, 22B are misaligned. In particular, the light emitter 24 in one transceiver is aligned with the light emitter in the other transceiver, but is not aligned with the detector 26 in the other transceiver. Thus, light 23 emitted by the narrow-beam emitter 24 in one transceiver 22A may not be detected by the detector 26 in the other transceiver. In such situations, transmission of optical data transfer between the transceivers may be compromised.

Figure 3:
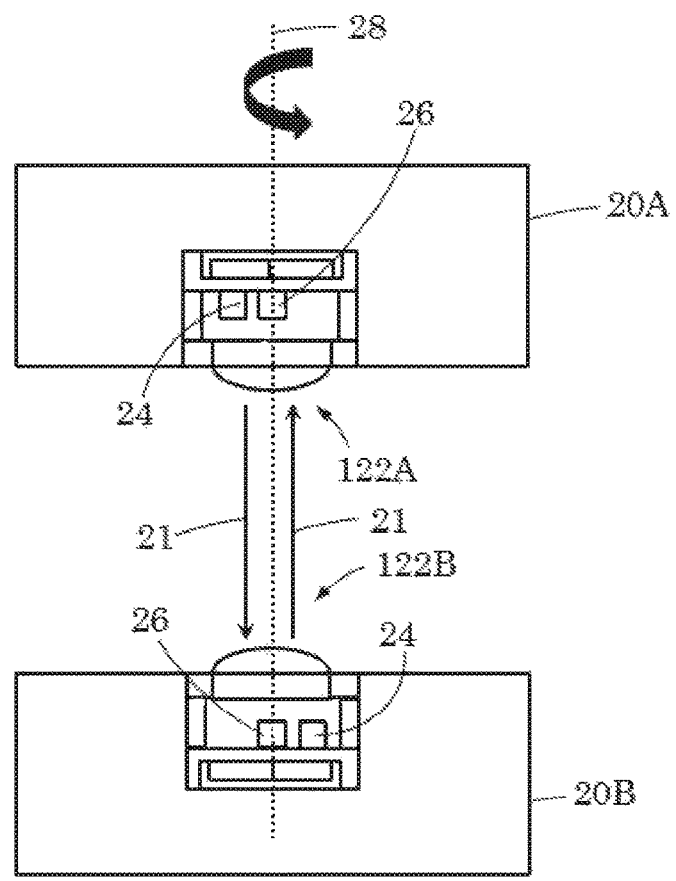
FIG. 3 illustrates an example of data being transferred optically between two device each having an optical sensor at a rotationally symmetric position.

To address the foregoing problem, as illustrated in FIG. 3, transceiver modules 122A, 122B are arranged with a respective optical detector 26 disposed in each module at a rotationally symmetric position. In particular, the detector 26 is disposed at a position intersecting the module's central axis 28, which is substantially parallel to the direction of optical emission/detection. The emitter 24 in each particular module should be disposed at a position sufficiently close to the detector 26 in the same module such that when two similar devices 20A, 20B are in close proximity to one another, optical data 21 from the emitter 24 in the first module 122A can be received by the detector 26 in the second module 122B, and vice-versa, even for narrow beam light emission. By locating each detector 24 at a rotationally symmetric position in the corresponding module, the detector 26 of one module will be able to receive optical data from the emitter 24 of the opposing module so long as the respective central axes 28 of the modules 122A, 122B are substantially aligned with one another. Even if one (or both) of the modules 122A, 122B is rotated about the modules' common axis 28, optical data transmission and reception between the modules 122A, 122B can be accomplished successfully without reduction in performance Thus, regardless of the angle of rotation, the detector 26 of each module will be within the angle of emission of the emitter 24 of the other module. In some implementations, each module 122A, 122B has a footprint of about 2 mm×2 mm.

Figure 4C:
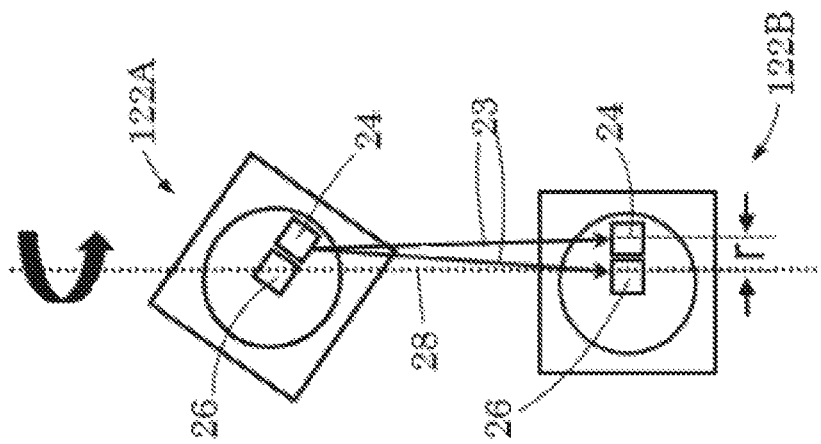
FIGS. 4A-4C illustrate data transfer between the devices of FIG. 3 at different relative rotational positions.
Figure 4B:
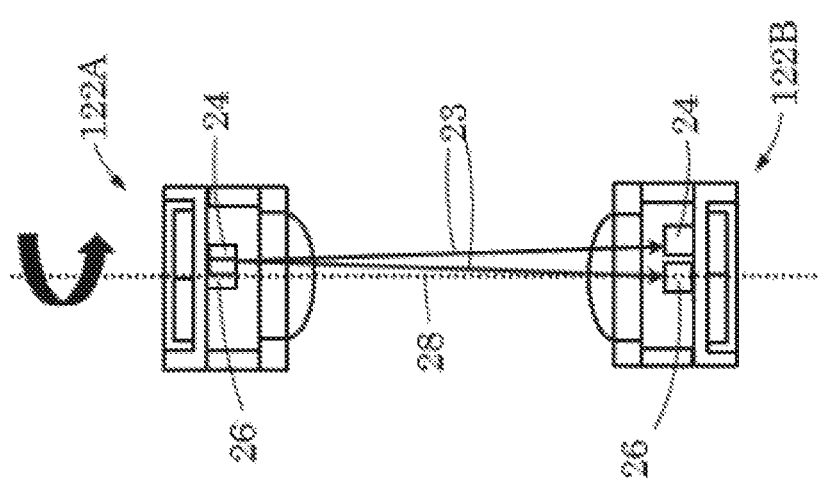
Figure 4A:
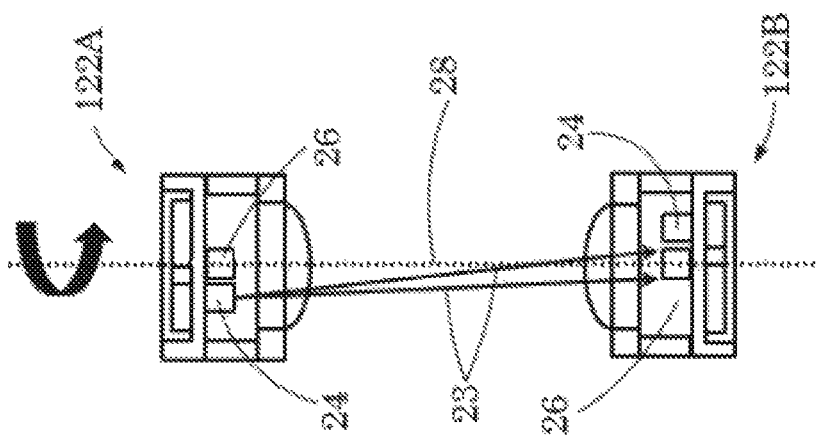

An example is illustrated in FIGS. 4A-4C, in which one of the modules 122A is rotated about the modules' common axis 28. FIG. 4A shows the module 122A in a first position, and FIGS. 4B-4C show the same module rotated about the axis 28 by about 120°. As illustrated in this example, the rotation axis 28 is orthogonal to two transceiver modules 122A, 122B that are in parallel planes. For a given transceiver-transceiver proximity, the beam divergence (i.e., emission angle) of the emitter 24 in the first module 122A projects a constant lateral distance (r) that encompasses the detector 26 in the second module 122B regardless of the rotational angle about the rotation axis. Thus, data transmission is not compromised regardless of the rotation angle. Transmission of an optical signal (e.g., data) from one module to the other can be triggered, for example, by a user pressing a specified button (or sequence of buttons) on the device 20A (or 20B) or performing a gesture such as a finger swipe across the device's display.

Figure 5A:
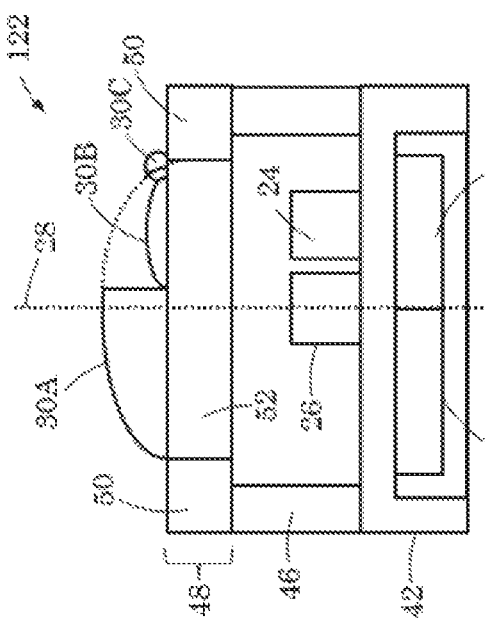
FIG. 5A is a top view of an optical transceiver having an optical sensor at a rotationally symmetric position.
Figure 5B:
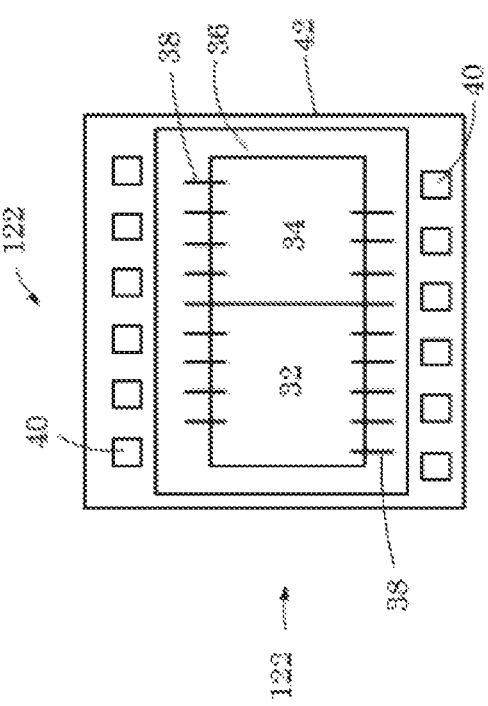
FIG. 5B is a side view of the optical transceiver of FIG. 5A.
Figure 5C:
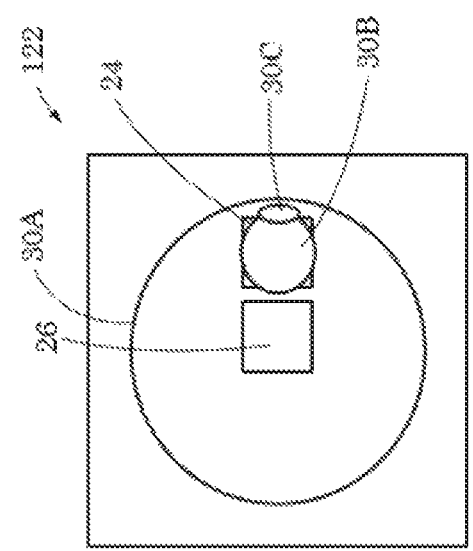
FIG. 5C is a bottom view of the optical transceiver of FIG. 5A.

FIGS. 5A, 5B and 5C illustrate further details of a particular implementation of a module 122 in which the light detector 26 is disposed at a rotationally symmetric position. The light emitter 24 and light detector 26 can be mounted, for example, on a printed circuit board (PCB) or other substrate 42. In some cases, at least a portion 36 of the substrate 42 is composed of silicon (see FIG. 5C). A silicon substrate may permit better electrical performance and/or better thermal management, which can enable faster response times for emitter and/or detector. The backside of the substrate 42 may include a cavity in which supporting architecture 32, 34 for the emitter and detector are provided (see FIG. 5B).

A spacer 46 separates the substrate 42 from an optics member 48, which may include a transmissive cover 52 over the emitter 24 and detector 26 (see FIGS. 5A and 5B). The spacer 46 may be composed, for example, of a flowable polymer material (e.g., epoxy, acrylate, polyurethane, or silicone) containing a non-transparent filler (e.g., carbon black, a pigment, an inorganic filler, and/or a dye). The transmissive cover 52 may be laterally embedded in, or surrounded by, the same non-transparent material 50 as the spacer 46. One or more beam shaping elements (e.g., lenses 30A, 30B, 30C) can be provided on a surface of the transmissive cover 52 above the detector 26 and/or emitter 24.

Electrical connections 38 (e.g., wiring) can be provided from the emitter 24 and/or detector 26 to the substrate 42, which may include bonding pads 40 or other supporting electronics (see FIG. 5C).

As explained above, in some applications it is desirable to provide a light emitter 24 having a relatively narrow field of view (FOV). Although such a feature is desirable (e.g., to facilitate high-speed data transfer), in some instances the emitter's narrow FOV may result in less than optimal data transfer, for example, when the two devices 20A, 20B are in very close proximity to one another (e.g., at a distance of less than about 2 mm).

To address the foregoing situation, the light emitter 24 preferably should have a narrow FOV in the far field (e.g., at distances in the range of 3-20 mm) and a wide FOV in the near field (e.g., at distances less than 3 mm) For example, as shown in FIGS. 6A and 6B, a first lens element 30A may be configured to facilitate collection of incoming light by the detector 26 from both the far field and near field, whereas second and third lens elements 30B, 30C can be configured to project light out of the module 122 into the far field and near field, respectively. In some instances, the second lens element 30B is designed to provide projection of light from the module with a FOV ("FOV2") in the range 20-40°, where the emitter 24 has a beam divergence ("$\alpha$") of about 10-30° at $1/e^2$ intensity. This relatively narrow FOV can be useful in the far field. On the other hand, the third lens element 30C can be designed to permit projection of light from the periphery of the emission angle (i.e., from the periphery of the diverged beam) of the emitter 24. The FOV ("FOV3") of the third lens element 30C can be, for example, in the range of about 40 to 80° (e.g., 60°). This relatively wide FOV can be useful in the near field. The third lens elements 30C can be implemented, for example, as a diffuser, a cylindrical lens array or a prismatic optical element. Different values for the FOVs and the distances corresponding to the near and far fields may be appropriate for some implementations.

In some instances, the lens element 30C may be implemented as a torus lens (i.e., doughnut-shaped), as depicted in FIG. 7A, such that the lens element 30C circumscribes the lens element 30B. In some implementation, lens element 30B may be positioned at the center of lens element 30C as depicted in FIG. 7A and FIG. 7B; however, in other implementations lens element 30B may be positioned off-center with respect to the center of lens element 30C, wherein lens element 30C may only partially circumscribe lens element 30B as depicted in FIG. 7C. In some implementations one or both lens elements 30B and 30C may be rotationally symmetric, asymmetric or aspheric. Still, in other implementations, the lens element 30C can be implemented as a micro-lens array as depicted in the example of FIG. 7D.

The first lens element 30A can be designed, for example, to optimize light collected by the detector 26 (e.g., light projected by an adjacent transceiver module). The FOV of the detector 26 ("FOV1") can be relatively large (e.g., 120°). However, if the field of view is too large, ambient light (i.e., light not from an emitter on an adjacent transceiver module) may interfere with light collection in the detector. Preferably, the FOV of the first lens element 30A (i.e., FOV1) is as at least as large as the FOV of the third lens element 30C (i.e., FOV3). For example, the FOV of the first lens element in some cases is at least 60°.

Various modifications can be made to the foregoing implementations. Further, in some cases, features from the different examples described above can be combined in a single embodiment. Accordingly, other implementations are within the scope of the claims.

What is claimed is:

1. An optoelectronic module comprising:
a transceiver operable to transmit data optically, the transceiver including:
a light emitter to emit light from the module; and
a light detector to detect light entering the module, the light detector being disposed at a rotationally symmetric position with respect to a central axis of the module,
a first lens element to project light from the light emitter out of the module into a far field; and
a second lens element to project light from the light emitter out of the module into a near field,
wherein the first lens element to project light into the far field has a narrower field-of-view than the second lens element to project light into the near field, and wherein the first and second lens elements are arranged such that light from the first lens element passes out of the module without passing through the second lens element, and such that light from the second lens element passes out of the module without passing through the first lens element.

2. The optoelectronic module of claim 1 wherein the light emitter and light detector are mounted on a substrate, and wherein the module's central axis is perpendicular to a plane of the substrate.

3. The optoelectronic module of claim 2 wherein the substrate is composed at least partially of silicon.

4. The optoelectronic module of claim 2 wherein the substrate has a cavity in a surface opposite a surface of the substrate on which the light emitter and light detector are mounted, and wherein supporting architecture for the light emitter and light detector are disposed within the cavity.

5. The optoelectronic module of claim 1 wherein the second lens element is a torus lens.

6. The optoelectronic module of claim 1 wherein the second lens element circumscribes the first lens element.

7. The optoelectronic module of claim 1 further including a third lens element to facilitate collection of incoming light by the light detector from both the far field and the near field.

8. The optoelectronic module of claim 1 wherein the light emitter is a laser diode or a vertical cavity surface emitting laser (VCSEL).

9. The optoelectronic module of claim 1 wherein both the light emitter and light detector are operable at a rate of gigabytes per second.

10. The optoelectronic module of claim 1 wherein the transceiver is operable in a half-duplex mode.

11. A first device operable to communicate with another such device, the first device comprising:
a transceiver module operable to transmit and receive data optically at a rate of gigabytes per second, the transceiver module including:
a light emitter to emit light from the device;
a light detector to detect light entering the transceiver module, the light detector being disposed at a rotationally symmetric position with respect to a central axis of the transceiver module;

a first lens element to project light from the light emitter out of the transceiver module into a far field; and a second lens element to project light from the light emitter out of the transceiver module into a near field, wherein the first lens element to project light into the far field has a narrower field-of-view than the second lens element, and wherein the first and second lens elements are arranged such that light from the first lens element passes out of the transceiver module without passing through the second lens element, and such that light from the second lens element passes out of the transceiver module without passing through the first lens element.

12. The first device of claim 11 wherein the transceiver module is operable in a half-duplex mode.

13. The first device of claim 11 further including a third lens element to facilitate collection of incoming light by the light detector from both the far field and the near field.

14. The first device of claim 11 wherein the light emitter is a laser diode or a vertical cavity surface emitting laser (VCSEL).

15. The first device of claim 11 wherein the light detector is a photodiode composed of one or more III-V compound semiconductor materials.

16. The first device of claim 11 wherein the first device is a handheld mobile device.

17. The first device of claim 16 wherein the handheld mobile device is a smart phone.

* * * * *